United States Patent
Hutchins (10) Patent No.: US 10,823,111 B2
(45) Date of Patent: Nov. 3, 2020

(54) ENERGY RECOVERY UNIT FOR VEHICLE USE

(71) Applicant: JAGUAR LAND ROVER LIMITED, Coventry, Warwickshire (GB)

(72) Inventor: William Hutchins, Coventry (GB)

(73) Assignee: JAGUAR LAND ROVER LIMITED, Warwickshire (GB)

( * ) Notice: Subject to any disclaimer, the term of this patent is extended or adjusted under 35 U.S.C. 154(b) by 9 days.

(21) Appl. No.: 16/091,464

(22) PCT Filed: Apr. 6, 2017

(86) PCT No.: PCT/EP2017/058180
§ 371 (c)(1),
(2) Date: Oct. 4, 2018

(87) PCT Pub. No.: WO2017/174693
PCT Pub. Date: Oct. 12, 2017

(65) Prior Publication Data
US 2019/0153977 A1     May 23, 2019

(30) Foreign Application Priority Data
Apr. 6, 2016 (GB) .................. 1605854.7

(51) Int. Cl.
*F02G 5/02* (2006.01)
*F02G 5/04* (2006.01)
(Continued)

(52) U.S. Cl.
CPC ............... *F02G 5/02* (2013.01); *F01N 5/025* (2013.01); *F02G 5/04* (2013.01); *H01L 35/30* (2013.01);
(Continued)

(58) Field of Classification Search
CPC .. F01N 2240/36; F01N 2410/00; F01N 5/025; F02G 5/02; F02G 5/04; H01L 35/30; Y02T 10/16; Y02T 10/166
See application file for complete search history.

(56) References Cited

U.S. PATENT DOCUMENTS

2010/0154396 A1    6/2010  Hahnl et al.
2011/0120106 A1*   5/2011  Bruck ..................... H01L 35/32
                                                    60/320
(Continued)

FOREIGN PATENT DOCUMENTS

DE    102007063173 A1    6/2009
DE    102008023937 A1    11/2009
(Continued)

OTHER PUBLICATIONS

Search and Examination Report, GB1605854.7, dated Sep. 29, 2016, 8 pages.
(Continued)

*Primary Examiner* — Phutthiwat Wongwian
*Assistant Examiner* — Diem T Tran
(74) *Attorney, Agent, or Firm* — Miller Nash Graham & Dunn LLP (57) ABSTRACT

An energy recovery unit (8) for use in a vehicle exhaust system (6), the energy recovery unit (8) comprising an inlet (24) for receiving exhaust gas from the exhaust system (6) and an outlet (26) for returning exhaust gas to the exhaust system (6). The energy recovery unit (8) further comprises a plurality of thermoelectric generators (20) disposed between the inlet (24) and the outlet (26), and a plurality of flow directing members (39). Each flow directing member (39) is configured to direct exhaust gas flow across at least one thermoelectric generator (20).

18 Claims, 11 Drawing Sheets

(51) Int. Cl.
*F01N 5/02* (2006.01)
*H01L 35/30* (2006.01)
(52) U.S. Cl.
CPC ...... *F01N 2240/36* (2013.01); *F01N 2410/00* (2013.01); *Y02T 10/16* (2013.01); *Y02T 10/166* (2013.01)

(56) References Cited

U.S. PATENT DOCUMENTS

2013/0152989 A1\* 6/2013 Krinn ..................... F01N 5/025
  136/210
2014/0182648 A1 7/2014 Seon

FOREIGN PATENT DOCUMENTS

| | | |
|---|---|---|
| DE | 102010001536 A1 | 8/2011 |
| DE | 102010030259 A1 | 12/2011 |
| JP | 2008128128 A | 6/2008 |
| JP | 2008274790 A | 11/2008 |
| JP | 2013165240 A | 8/2013 |
| KR | 1020130073411 A | 7/2013 |
| WO | 2011107282 A1 | 9/2011 |
| WO | 2015111459 A1 | 7/2015 |

OTHER PUBLICATIONS

International Search Report and Written Opinion, PCT/EP2017/058180, dated May 23, 2017, 12 pages.
Search and Examination Report, GB1705544.3, dated Jun. 12, 2017, 5 pages.

\* cited by examiner

ENERGY RECOVERY UNIT FOR VEHICLE USE

CROSS-REFERENCE TO RELATED APPLICATIONS

This application is a 371 of International Application No. PCT/EP2017/058180, filed Apr. 6, 2017, which claims priority to GB Patent Application 1605854.7, filed Apr. 6, 2016, the contents of both of which are incorporated by reference herein in their entirety.

TECHNICAL FIELD

The present disclosure relates to an energy recovery unit for use in a vehicle exhaust system. Aspects of the invention relate to an energy recovery unit, and to a vehicle exhaust system or a vehicle incorporating such an energy recovery unit.

BACKGROUND

Thermoelectric generators (TEGs) convert heat energy to electrical energy using the Seebeck effect. A typical TEG comprises a plurality of metal plates having high thermal conductivities with thermoelectric materials between them, sandwiched between covers made of a dielectric, substrate material.

It is well-known that vehicle engines are only about 30% efficient, and in normal use generate significant waste heat. Over recent years, TEG devices have been incorporated into vehicle exhaust systems in order to harness waste heat from the exhaust gas. This decreases the load of an electric generator such as an alternator on the engine, in turn improving fuel consumption.

A problem associated with using TEGs in this way is that they only operate efficiently over a relatively narrow temperature range—at low temperatures, energy generation is very inefficient; and at high temperatures, the thermoelectric materials are in danger of damage from overheating. In certain scenarios, it has been found that the leading edges of the TEGs may overheat before the majority of the TEG has reached a suitably high temperature for efficient operation to occur. As a result, the hot exhaust air must be diverted away from the thermoelectric materials using bypass valves to prevent damage to the TEG, thereby decreasing the system performance.

The present invention has been devised to mitigate or overcome at least some of the above-mentioned problems.

SUMMARY

According to an aspect of the present invention there is provided an energy recovery unit for use in a vehicle exhaust system, the energy recovery unit comprising: an inlet for receiving exhaust gas from the exhaust system; an outlet for returning exhaust gas to the exhaust system; a plurality of thermoelectric generators disposed between the inlet and the outlet; and a plurality of flow balancing flow directing members, each flow directing member being configured to direct exhaust gas flow across a respective thermoelectric generator and to balance exhaust gas flow between the plurality of thermoelectric generators.

Advantageously, the flow directing members distribute exhaust gas flow evenly throughout the energy recovery unit, so that the heat-exchanging surface of each thermoelectric generator is subjected to a similar flow rate. This means that the energy recovery unit is able to utilise the available thermoelectric energy generation capacity provided by the plurality of thermoelectric generators more efficiently, increasing system performance and prolonging the energy recovery unit's lifespan. A further benefit of even flow distribution across each thermoelectric generator is that each generator produces similar electrical power, which is beneficial from a control perspective.

Each flow directing member of the energy recovery unit may be disposed adjacent to a leading edge of its respective thermoelectric generator. Positioning each flow directing member in this way is particularly advantageous as the flow directing member creates a protective thermal barrier between its respective leading edge and the exhaust gas flow, allowing the leading edges to cool more quickly after use. Consequently, thermoelectric generation can be resumed more quickly and therefore more of the energy contained in the exhaust gas is utilised to generate electricity.

Furthermore, each flow directing member may be separated from the leading edge of its respective thermoelectric generator by a gap. The gap may be configured to separate the leading edge of the respective thermoelectric generator from the exhaust gas and from the respective flow directing member. Incorporating a gap in this way creates more beneficial thermal protection to each leading edge, ensuring that each of the leading edges does not overheat from overexposure to the heat of the exhaust gas flowing over it. Moreover, the gap separates the leading edges from the flow directing members, reducing indirect heating of the leading edges by the flow directing members.

In one embodiment, the gap may be gas permeable, may comprise a gas permeable material, and/or may incorporate an adhesive. A gap that allows gas flow through it forms a particularly efficient pressure balancing system. Beneficially, the gap ensures that the exhaust gas flow past each thermoelectric generator is balanced, or becomes balanced if initially uneven. The incorporation of an adhesive is advantageous in that the flow directing members may be attached directly to the leading edge of each thermoelectric generator without inhibiting the performance of the generator.

Each flow directing member may be connected to an adjacent flow directing member which allows the flow directing members to act as structural components for the thermoelectric generators. This is beneficial for the assembly and efficiency of the energy recovery unit.

The size of the flow directing members may be non-uniform. For example, it is possible that the size of each flow directing member may be inversely proportional to its distance from the inlet. Tailoring the size of the flow directing members is particularly advantageous in that it allows the exhaust gas flow past each of the thermoelectric generators to be altered and the electricity generation potential of the unit to be maximised.

Configuring the flow directing members to be of a size inversely proportional to the distance from the inlet provides a particularly optimal arrangement for maximising the electricity produced by the unit. Variation in the size of the flow directing member also benefits the design of the unit, allowing non-uniformly shaped units to be incorporated where necessary.

The flow directing members may be positioned at both ends of at least one thermoelectric generator to provide a thermal barrier at both ends thereof.

The flow directing members may be curved, fin-shaped or wedge-shaped such that adjacent flow directing members will direct at least a portion of the exhaust gases away from the leading edges of the thermoelectric generators.

The energy recovery unit may further comprise a mesh structure extending over gas inlets to the thermoelectric generators. The mesh may provide a resistance to gas flow that varies with position relative to the gas inlet in order to further balance flow between the plurality of thermoelectric generators. For example, the porosity of the mesh may vary or the number of layers of mesh may vary to provide this effect. In embodiments, the mesh has a greater porosity and/or fewer layers closer to the inlet.

The energy recovery unit may further comprise a valve arrangement operable to direct exhaust gas entering the inlet across each thermoelectric generator. In this embodiment, the valve arrangement is operable to vary the direction of exhaust gas flow across each thermoelectric generator. A valve arrangement of this type is particularly advantageous as it prevents overheating of the leading edges of the thermoelectric generators, thereby prolonging their lifespan.

The energy recovery unit may further comprise a gas pipe network configured to connect the inlet and the outlet of the unit. The gas pipe network may comprise two bypass ducts disposed along respective opposing ends of the plurality of thermoelectric generators, each bypass duct extending between the inlet and the outlet of the unit.

Each thermoelectric generator may be spaced from its neighbouring thermoelectric generator(s) to define a plurality of exhaust gas passages, wherein the exhaust gas passages allow exhaust gas to flow between the two bypass ducts. The exhaust gas passages may be arranged such that a flow direction through each exhaust gas passage is substantially perpendicular to a flow direction through each bypass duct.

Orienting the gas passages and bypass ducts in this way leads to a variety of operational configurations depending on the heat of the exhaust flow gas and thermoelectric generators, and the demands of the system. Exhaust gas can therefore flow through the bypass ducts only, through the exhaust gas passages in a first direction, through the exhaust gas passages in a second direction, or a combination of through the bypass ducts and the exhaust gas passages. This is beneficial in that energy generation can be optimised while ensuring that no damage is done to the thermoelectric generators.

The energy recovery unit may be configured to operate in a bypass mode in which exhaust gas can flow from the inlet to the outlet via the bypass ducts without entering the exhaust gas passages of the thermoelectric generators, wherein the flow directing members are configured to act as thermal barriers to separate the exhaust gas flow from the leading edges of each thermoelectric generator in the bypass mode.

According to another aspect of the present invention, there is provided a vehicle exhaust system comprising the energy recovery unit as described above.

According to a further aspect of the present invention, there is provided a vehicle comprising the energy recovery unit or the vehicle exhaust system as described above.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

One or more embodiments of the invention will now be described, by way of example only, with reference to the accompanying drawings, in which.

DETAILED DESCRIPTION

Figure 1:
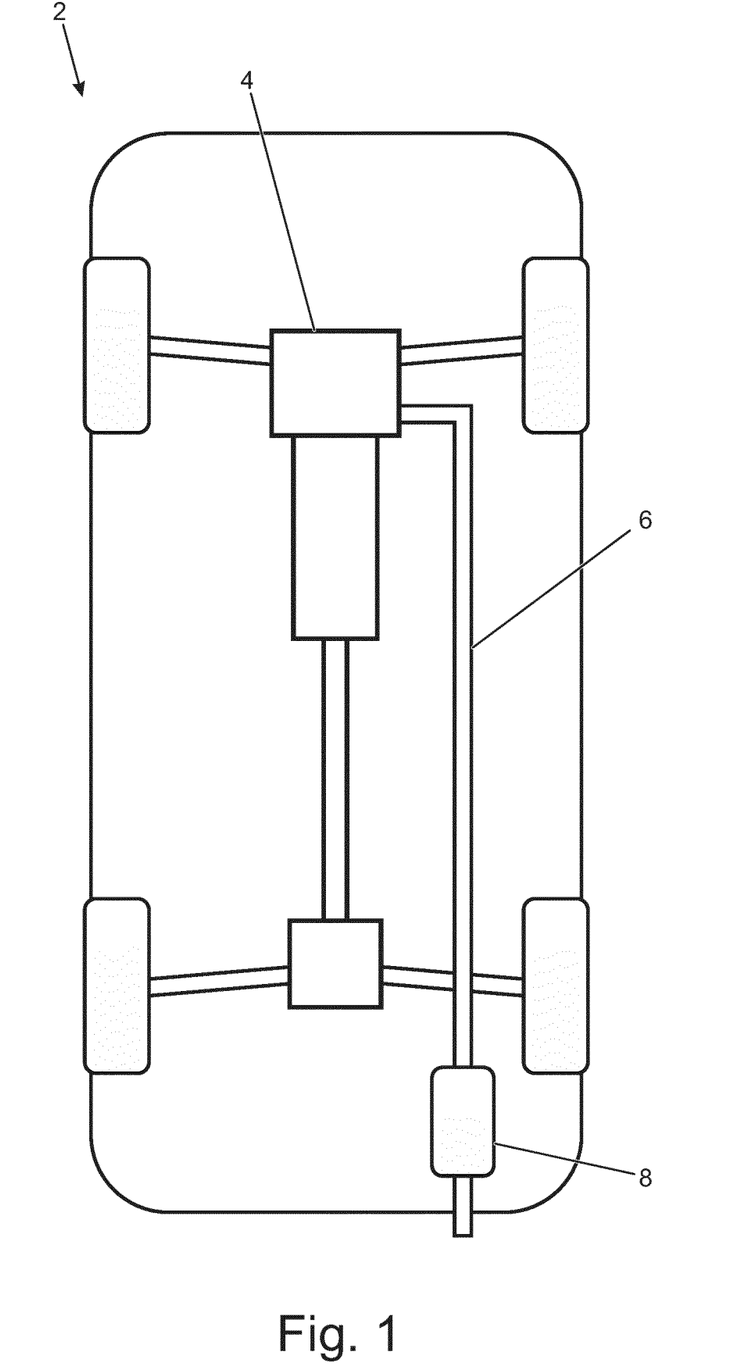
FIG. 1 is a schematic block diagram of a vehicle incorporating an energy recovery unit according to an embodiment of the present invention, which may be implemented in a vehicle exhaust system.

FIG. 1 is a schematic block diagram of a vehicle 2 which comprises an engine 4 connected to a vehicle exhaust system 6. An energy recovery unit 8 is incorporated in the vehicle exhaust system 6 in accordance with an embodiment of the present invention. The hot exhaust gas from the vehicle exhaust system 6 passes through the energy recovery unit 8 before it is expelled from the vehicle 2. The energy recovery unit 8 harnesses the heat energy from the exhaust gas passing through it, converting the heat energy into electrical energy using thermoelectric generators (not shown in FIG. 1).

Figure 2:
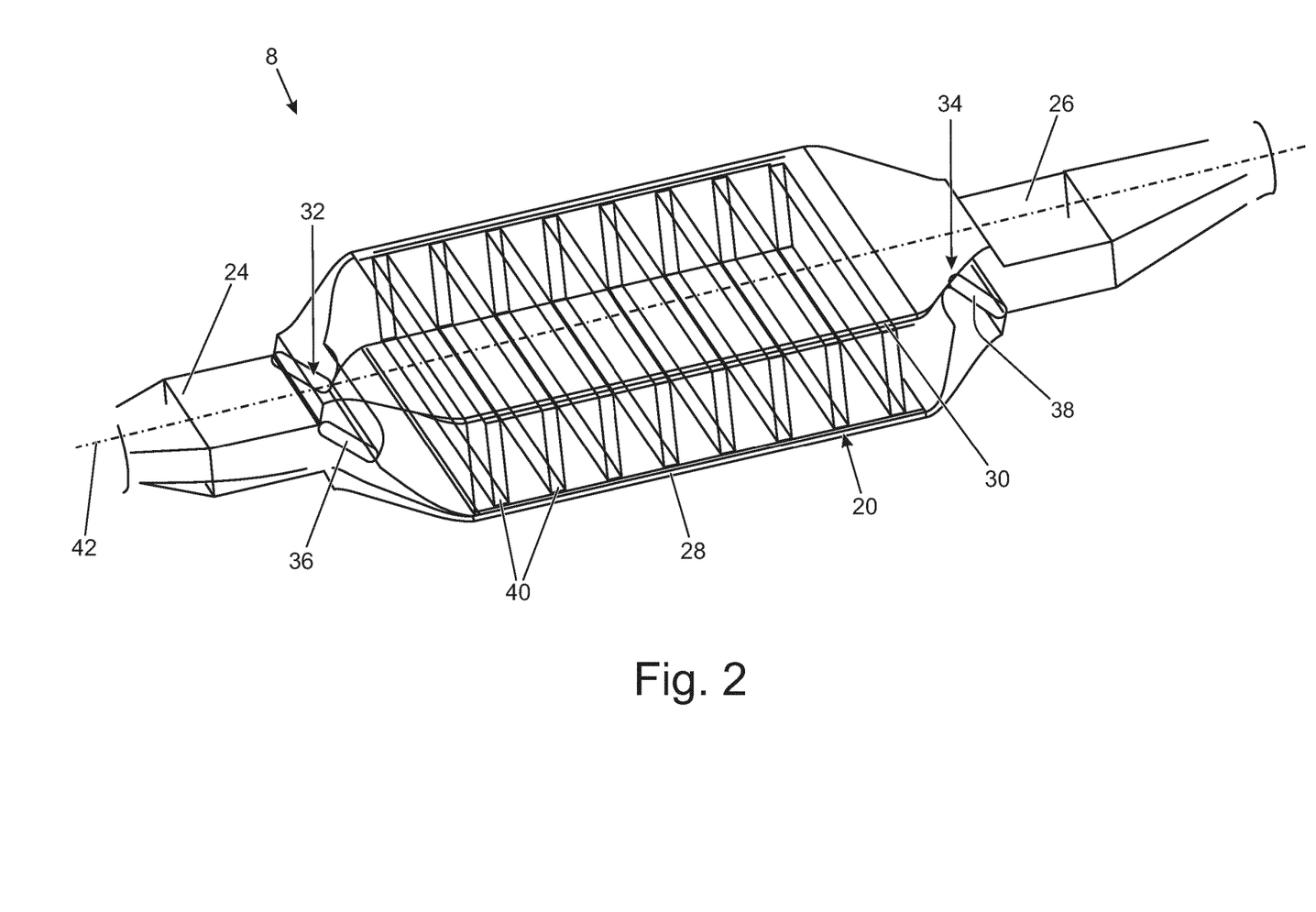
FIG. 2 is a perspective, transparent view of an energy recovery unit showing an internal TEG module according to an embodiment of the invention.

FIG. 2 shows a perspective view of the energy recovery unit 8 of FIG. 1. The energy recovery unit 8 comprises a TEG module 20 surrounded by a gas pipe network. The gas pipe network comprises an inlet in the form of an inlet pipe 24 and an outlet in the form of an outlet pipe 26 disposed at respective opposed ends of the energy recovery unit 8. Two separate bypass ducts 28, 30 are positioned above and below the TEG module 20 to connect the inlet and outlet pipes 24 and 26. The TEG module 20 comprises a plurality of TEG units 40 arranged in parallel to each other, orthogonal to and positioned at regular intervals along a main axis 42 of the TEG module 20, and spaced from the adjacent or neighbouring TEG unit(s) 40.

The energy recovery system 8 also comprises an inlet valve 32 positioned at the junction of the bypass ducts 28, 30 directly opposite and in the vicinity of the inlet pipe 24, and an outlet valve 34 positioned at the junction of the bypass ducts 28, 30 directly opposite and in the vicinity of the outlet pipe 26. The inlet valve 32 and the outlet valve 34 each comprise a valve flap 36, 38 which can be rotated to alter the orientation of the valves 32, 34, thereby controlling the direction of exhaust gas flow through the energy recovery unit 8, typically by guiding exhaust flow into and out of one of the bypass ducts 28, 30. Movement of each valve flap 36, 38 is controlled by a respective valve actuator (not shown) which controls the degree and direction of deflection of each valve flap 36, 38, thereby controlling the direction of exhaust gas flow through the energy recovery unit 8.

In some embodiments, the valve actuators are independently operable, such that one valve may be open to a greater extent than the other. In other embodiments, the valve actuators are operated using a single 'master' lever (not shown), enabling both valves to be controlled simultaneously, such that the deflections of the valve flaps mirror one another.

In some modes of operation, the exhaust gas passes from the inlet pipe 24 to the outlet pipe 26 exclusively through one or both of the bypass ducts 28, 30, bypassing the TEG module 20 entirely and defining a main gas flow direction. In other modes of operation, some or all of the exhaust gas flows through the TEG module 20 in a cross-flow direction that is substantially orthogonal to the main flow direction. A more detailed description of modes of operation of the energy recovery unit 8 is provided subsequently with reference to FIGS. 4a to 4c.

The energy recovery system 8 also comprises a plurality of flow directing members 39 (not shown in FIG. 2 for clarity) positioned adjacent the leading edges of the TEG units 40. The flow directing members 39 serve to balance exhaust gas flow throughout the energy recovery unit 8 so that each TEG unit 40 receives a similar flow rate of exhaust gas. A more detailed description of the flow directing members 39 is provided subsequently with reference to FIG. 5.

Figure 3:
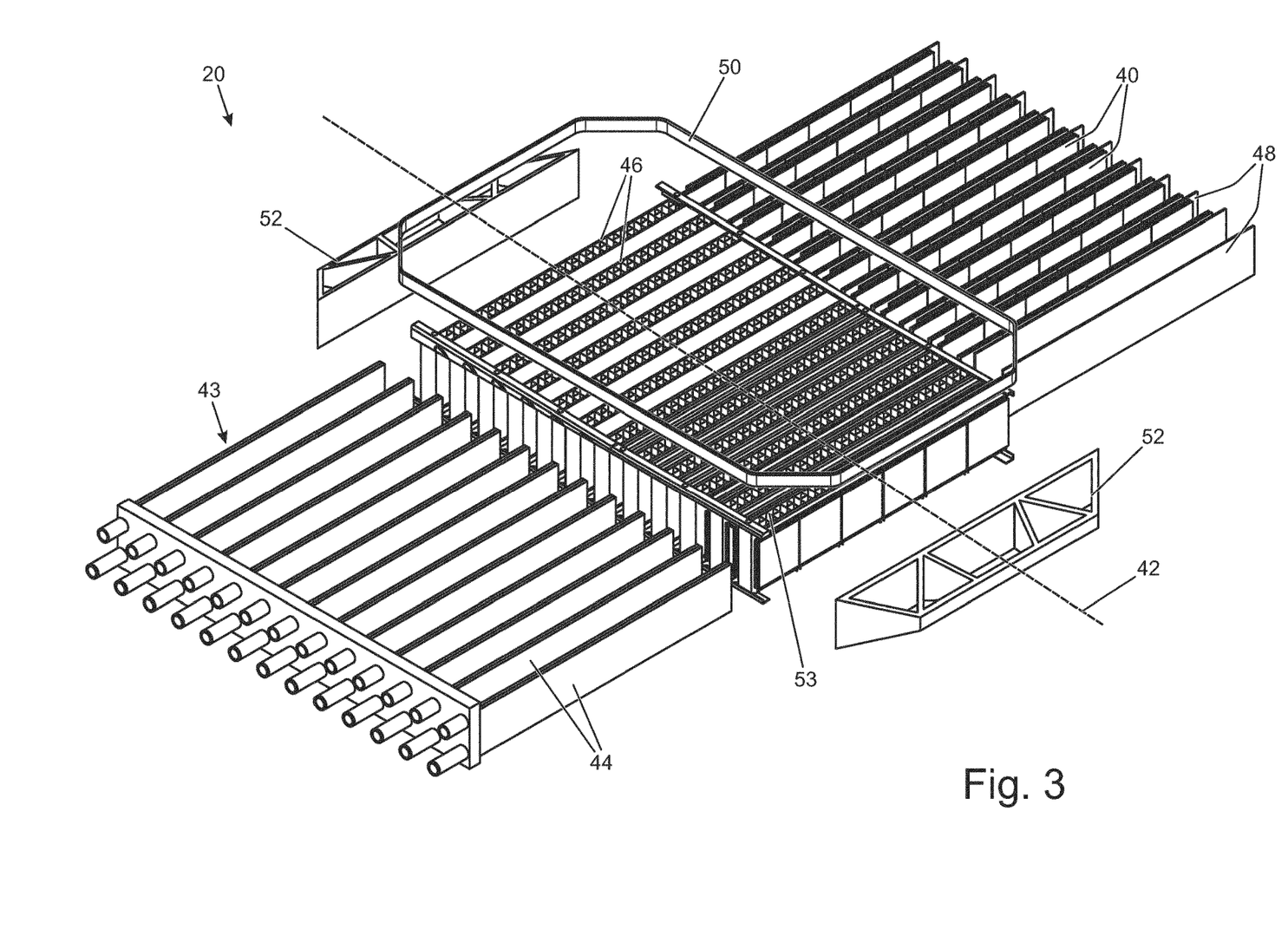
FIG. 3 is an exploded, perspective view of a TEG module according to an embodiment of the invention that may be incorporated into the energy recovery unit shown in FIG. 2.

FIG. 3 shows an exploded, perspective view of a TEG module 20 according to an embodiment of the present invention that is incorporated into the energy recovery unit 8 of FIG. 2.

The TEG module 20 comprises a plurality of TEG units 40 arranged in parallel to one another, and lying orthogonal to a plane containing a main axis 42 of the TEG module 20. The TEG units 40 are spaced from neighbouring TEG unit(s) at regular intervals along the main axis 42.

Each TEG unit 40 comprises a plurality of metal plates having high thermal conductivities with thermoelectric materials between them, sandwiched between covers made of a dielectric, substrate material (such as a ceramic), as is known in the art. Outer faces of the dielectric covers define heat-exchanging surfaces of the TEG unit 40—a hot-side heat-exchanging surface and a cold-side heat exchanging surface. The hot-side heat exchanging surfaces of opposed TEG units 40 are defined by a common metal structure comprising a metal plate of each TEG unit 40 joined by a bridge to create a structure of generally 'U' shaped cross-section.

The TEG units 40 are arranged in use such that the main heat-exchanging surfaces are substantially orthogonal to the main axis 42 of the TEG module 20, with the TEG units 40 disposed in alternating orientation such that the hot-side heat exchanging surface of each TEG unit 40 faces the hot-side heat exchanging surface of a facing TEG unit 40.

The TEG module 20 further comprises a coolant pipe array 43. The coolant pipe array 43 comprises a plurality of U-flow coolant pipes 44 having an inlet end and an outlet end, wherein both the inlet end and the outlet end are disposed at the same end of each U-flow coolant pipe 44, with one positioned above the other in the vertical direction. The coolant fluid within each U-flow coolant pipe 44 therefore flows in one direction into the U-flow coolant pipe 44 from the inlet, and in the opposite direction towards the outlet and out of the U-flow coolant pipe 44. The plurality of U-flow coolant pipes 44 are interspersed within the TEG module 20, such that each U-flow coolant pipe 44 is disposed between and in substantially parallel alignment with each pair of cold-side heat exchanging surfaces of opposed TEG units 40, and adjacent to the outward facing cold-side heat exchanging surfaces of the TEG units 40 at each end of the TEG module 20. Each U-flow coolant pipe 44 is arranged such that the portion of the pipe in which the coolant fluid flows in from the inlet extends substantially parallel to, and in contact with, the cold-side heat exchanging surface of the associated TEG unit 40.

The TEG module 20 further comprises a pair of parallel metal plates that extend substantially parallel to, and in contact with, the hot-side heat exchanging surface of each TEG unit 40. These plates create a series of channels defining exhaust gas passages 46 through which the exhaust gas may flow through the TEG module 20.

A plurality of wedges 48 are inserted in the TEG module 20 to separate adjacent U flow coolant pipes 44 of adjacent TEG units 40. A clamping band 50 extends around the perimeter of the TEG module 20, co-planar with the main axis 42 along which the components of the TEG module 20 are arranged. The TEG module 20 is further provided with a pair of bridge-like end buffers 52 positioned at either end of the main axis of the TEG module 20. After assembly, the wedges 48 remain in place in the TEG module 20 to ensure the coolant pipes 44 remain firmly in place.

Accordingly, in the TEG module arrangement shown in FIG. 3, the main component parts are provided in the following order: U-flow coolant pipe 44, TEG unit 40, exhaust gas passage 46, TEG unit 40, U-flow coolant pipe 44, wedge 48, U-flow coolant pipe 44, TEG unit 40, exhaust gas passage 46, TEG unit 40, U-flow coolant pipe 44, wedge 48, and so on.

In use, hot exhaust gas is directed through the exhaust gas passages 46 of the TEG module 20, increasing the temperatures of the hot-side heat-exchange surfaces. Meanwhile cooling fluid (e.g. water) is passed through the cooling pipe array 43 of the TEG module 20 to maintain the temperatures of the cold-side heat exchange surfaces. This produces the necessary temperature gradient across each TEG unit 40 to produce energy. The use of cooling fluid maximises the temperature gradient and in turn the electrical output of each TEG unit.

In some embodiments, convector fins 53 such as those found in standard convection radiators may extend from each hot-side heat exchanging surface into the exhaust gas passages 46. The presence of the convector fins 53 increases the surface area of heat conductive material in contact with the hot exhaust gas, thereby increasing the heat transfer to the hot-side heat exchange surfaces along the exhaust gas passages 46.

Various measures are taken to ensure that the cold-side heat exchange surfaces are held in close contact with the U-flow coolant pipes 44 for maximised heat transfer. For example, as noted above wedges 48 are inserted between the adjacent U-flow coolant pipes 44. The clamping band 50 also generates an inwardly-directed clamping force on the TEG module 20 components, and the end buffers 52 spread the effects of this clamping force more evenly across the cross-section of the TEG module 20 to prevent any warping or deformation of the components due to uneven pressure.

It should be noted that all directional references herein, for example references to 'left', 'right', 'up', 'down', 'vertical', and 'horizontal', are made with respect to the embodiments shown in the appended figures. However it will be appreciated that the energy recovery unit and its constituent components may be arranged and mounted in use in different orientations to those shown in the appended figures, and that such arrangements should be deemed to fall within the scope of the present invention, as defined by the accompanying claims.

Figure 4A:
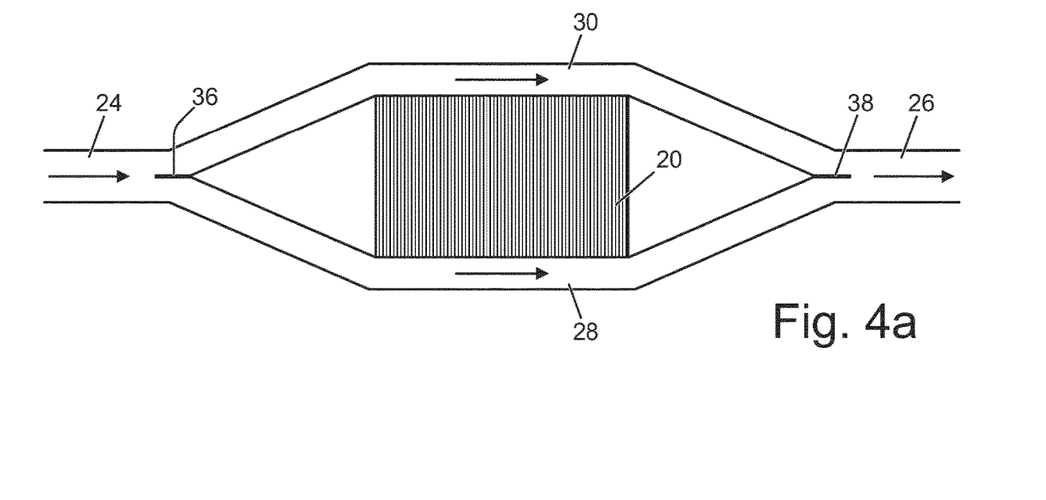
FIGS. 4a to 4c are schematic plan views of the energy recovery unit shown in FIG. 2, operating in different modes in accordance with various embodiments of the present invention.
Figure 4B:
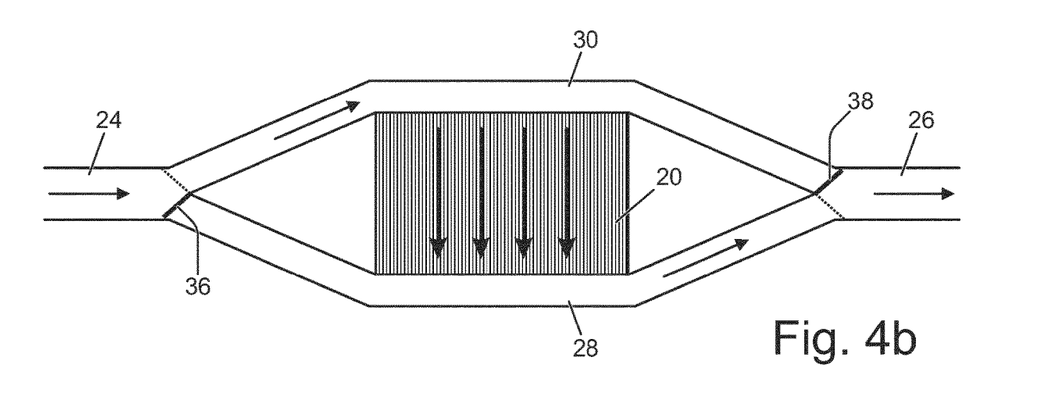
Figure 4C:
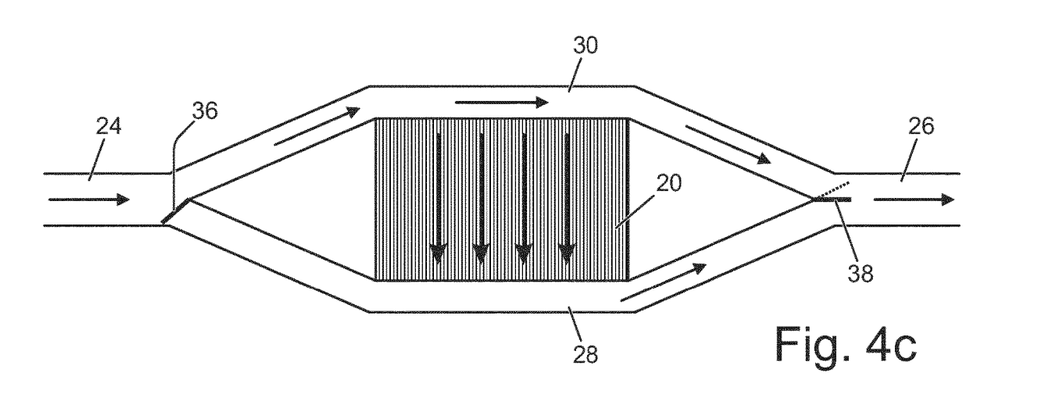

FIGS. 4*a* to 4*c* are schematic side views of the energy recovery unit of FIG. 2 as viewed from the side and illustrate different operating modes of the energy recovery unit.

Each operating mode is associated with a different configuration of the inlet and outlet valves. Specifically, each operating mode is defined by the relative proportions of exhaust gas flowing through the TEG module 20 and the bypass ducts 28, 30, which are determined by the degree to which each valve flap 36, 38 is deflected relative to the main flow direction of the exhaust gas, and the directions in which the deflections occur. Three main modes of operation exist—a 'bypass' mode, illustrated in FIG. 4*a*; a 'full flow' mode, illustrated in FIG. 4*b*; and a 'feathering' mode, illustrated in FIG. 4*c*.

In the bypass mode, neither the inlet valve flap 36 nor the outlet valve flap 38 is substantially deflected, and so remain substantially parallel to the main flow direction of the exhaust gas. This allows the exhaust gas to flow unimpeded from the inlet pipe 24 past each side of the inlet valve, into the bypass ducts 28, 30, past the outlet valve and subsequently exit the energy recovery unit 8 through the outlet pipe 26 without entering the TEG module 20 at all.

It is noted that the exhaust gas will not change direction so as to enter an exhaust gas passage 46 of the TEG module 20 unless there is significant resistance to flow along the bypass ducts 28, 30. Therefore in the bypass mode, substantially all of the exhaust gas flows through the bypass ducts 28, 30.

The energy recovery unit 8 is operated in the bypass mode when the TEG module 20 is in danger of overheating. For example, this can occur when the exhaust gas entering the energy recovery unit is at too high a temperature, or when the exhaust gas has been flowing through the TEG module 20 for a prolonged period of time.

In the full flow mode, the inlet valve flap 36 and outlet valve flap 38 are maximally deflected in opposite directions, each extending completely across a mouth of a different one of the bypass ducts 28, 30. This prevents the gas flow from exiting the energy recovery unit 8 from the same bypass duct through which it entered, and so forces all of the exhaust gas through the TEG module 20, as no direct route through either bypass duct 28, 30 from the inlet pipe 24 to the outlet pipe 26 is available for the gas to flow.

For example, as may be seen from the plan view of FIG. 4*b*, the inlet valve flap 36 is deflected maximally downwards, causing the exhaust gas to flow entirely into the upper bypass duct 30; however, as the outlet valve flap 38 is deflected maximally upwards, the exhaust gas cannot exit the energy recovery unit 8 through the outlet pipe 26 directly from the upper bypass duct 30. Instead, the exhaust gas from the upper bypass duct 30 is forced through the exhaust gas passages 46 of the TEG module 20 and into the lower bypass duct 28, in order to reach the outlet pipe 26. The direction of cross-flow through the gas passages 46 of the TEG module 20 may be reversed by reversing the direction of deflection of the input and output valve flaps 36, 38 (as indicated by the dotted lines in FIG. 4*b*).

As a result of efficient heat exchange between the exhaust air and the metal plates of the TEG units 40, and the electrical energy generated from that heat, the exhaust gas cools significantly as it passes through each exhaust gas passage 46. Therefore the leading edges of each TEG unit 40 heat up much more quickly than the rest of the unit.

In an embodiment of the present invention, the direction of deflection of the valve flaps, and hence the direction of cross-flow through the exhaust gas passages 46 of the TEG module 20, is periodically alternated. This prevents overheating of the leading edges of the TEG module 20, thereby prolonging its lifespan.

The performance of the energy recovery unit 8 is also improved as the alternating flow creates a more even temperature profile across each hot-side heat exchanging surface than is achieved with a single direction flow. This means that the bypass mode is used less frequently, and more of the exhaust gas is utilised by the TEG module 20 to generate electricity.

In the feathering mode, shown in FIG. 4*c*, the inlet and outlet valve flaps 36, 38 are deflected to different degrees, with neither bypass duct 28, 30 fully closed. This allows some gas flow through the bypass ducts 28, 30, but creates sufficient resistance to flow to force some of the exhaust gas into the TEG module 20. The feathering mode may therefore be thought of as a combination of the bypass and full flow modes.

For example, as may be seen in FIG. 4*c*, the inlet valve flap 36 is deflected maximally downwards, while the output valve flap 38 remains substantially parallel to the main flow direction. The exhaust gas therefore flows along one of two paths: the first path corresponds to direct flow from the inlet pipe 24 to the outlet pipe 26 through the upper bypass duct 30; the second path corresponds to flow from the upper bypass duct 30, through the gas passages 46 of the TEG module 20 to the lower bypass duct 28, and into the outlet pipe 26.

The degree and direction of deflection of the output valve flap 38 may be varied (as indicated by the dotted line in FIG. 4*c*) depending on the proportion of gas that is intended to flow through the gas passages 46 of the TEG module 20. A greater upwards deflection of the outlet valve flap 38 in FIG. 4*c* results in a higher proportion of gas passing through the TEG module 20.

This mode is useful to ensure that at high gas temperatures the amount of exhaust gas passing through the TEG module 20 (and hence the amount of heat input to each TEG unit 40) is supported by the water cooling capabilities of the coolant pipe array 43.

Although specific valve deflections are shown in FIGS. 4*a* to 4*c*, it should be noted that the functionality of the energy recovery unit 8 would not be substantially affected if the deflections of the inlet valve flap 36 and the outlet valve flap 38 were to be reversed from that which is illustrated. For example, in the feathering mode, it is sufficient for either one of the valve flaps 36, 38 to be maximally deflected in a particular direction, so long as the angle of deflection of the other valve flap remains variable, in order to control the amount of exhaust gas flowing through the TEG module 20.

It should be noted that the presence of independently operable valves would be a useful element of those embodiments where the energy recovery unit operates in the feathering mode, as this would enable precision control of each valve flap. By comparison, the presence of a 'master' lever would be a useful addition in those embodiments where the energy recovery unit operates in the bypass or full flow modes, as the degree of deflection of the two valve flaps should ideally mirror each other. The use of the master lever to automate the valve deflections would be particularly useful when periodically alternating flow is required.

At this point, it is noted that the energy recovery units 8 described above provide context for the present invention, which may alternatively be applied to other types of unit, for example units incorporating only a single bypass duct.

In general terms, embodiments of the invention provide flow directing members 39 that are used to balance the flow of exhaust gas across each TEG unit 40 of the TEG module 20. It is noted that gas flowing into a bypass duct 28, 30 will not change direction to enter an exhaust passage 46 without sufficient force being applied to it to cause a change in momentum, for example, if the pressure difference between the bypass duct 28, 30 and an exhaust gas passage exceeds a certain level. Accordingly, without features to direct exhaust flow into the exhaust gas passages 46, the gas travels as far as possible into a bypass duct 28, 30 before turning through 90° as pressure builds towards the end of the duct 28, 30 to flow into an exhaust gas passage 46. This results in a higher proportion of exhaust gas flow through the exhaust gas passages 46 furthest from the inlet pipe 24 than through those closer to the inlet pipe 24.

This creates two problems: firstly, as each TEG unit 40 is subjected to a different exhaust gas flow rate, many of the units 40 will not operate in their optimum range and so energy recovery from the exhaust gas will be compromised; and secondly, as each TEG unit 40 experiences a different flow rate each will generate a different electrical current, which is difficult to handle from a control perspective.

In this context, the flow directing members 39 act to create a more balanced flow distribution throughout the TEG module 20, thereby addressing the above problems and improving the performance of the energy recovery unit 8. It is noted that the height of the flow directing members 39 can be adjusted to optimise the flow profile throughout the TEG module 20, thereby offering further optimisation.

Figure 5:
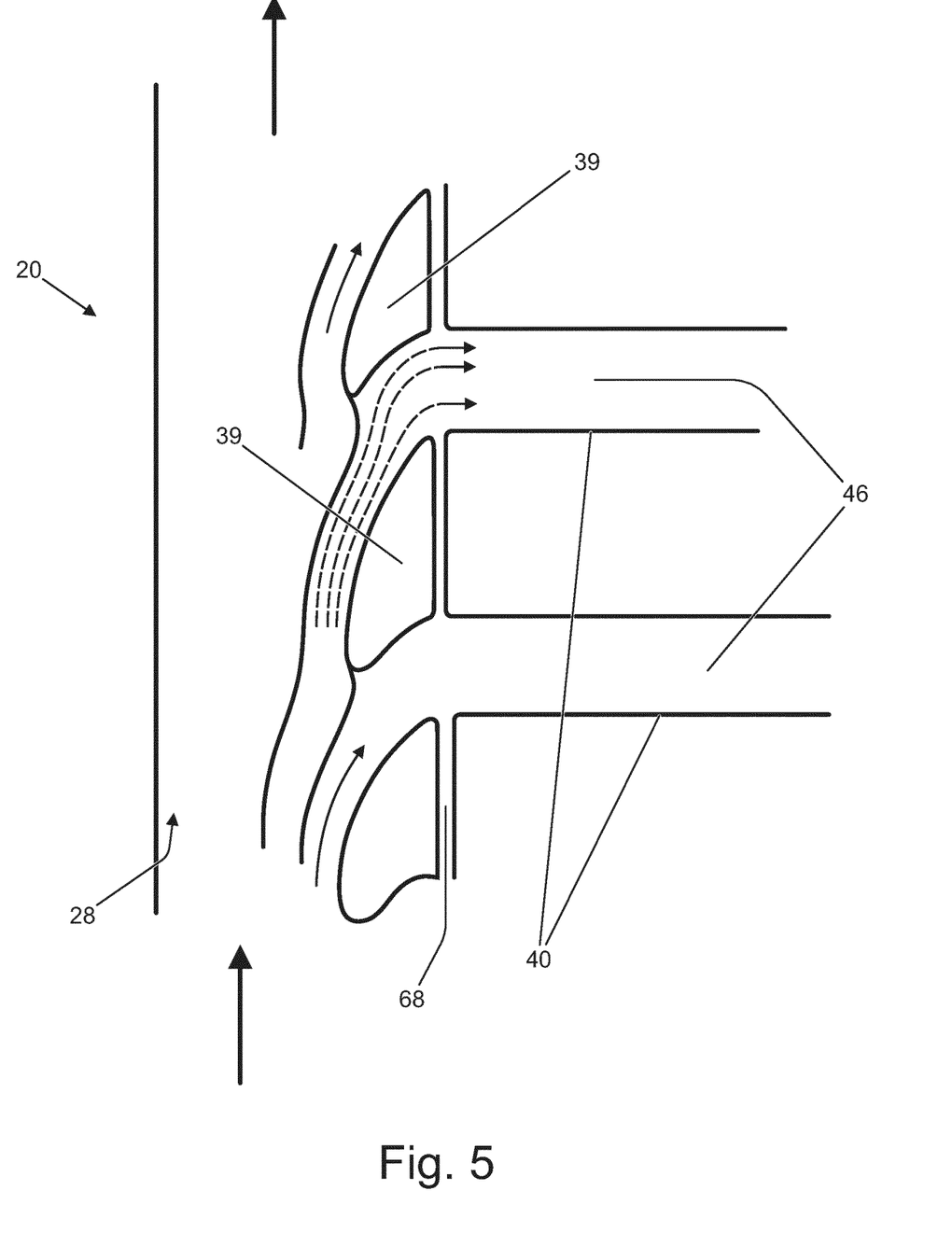
FIG. 5 is a top, fragmentary view of the TEG module shown in FIG. 2 showing flow directing members according to an embodiment of the invention.

FIG. 5 shows a side, fragmentary view of a bypass duct 28 and upper ends of a series of TEG units 40 of the TEG module 20 such as that shown in FIG. 3. As shown, a respective flow directing member 39 in the form of a turning vane is disposed at the upper end of each individual TEG unit 40.

In FIG. 5, each flow directing member 39 is positioned on the leading edge of its respective TEG unit 40 in order to adjust the proportion of gas that flows through each exhaust gas passage 46 of the TEG module 20, thereby balancing the flow through each exhaust gas passage 46. The height of the flow directing members 39 may vary depending on the application, but a taller flow directing member 39 results in a higher proportion of gas being drawn into the respective exhaust gas passage. It should be noted, however, that it is not necessary to position flow directing members 39 on each leading edge, and other embodiments may comprise differing arrangements of flow directing members.

In bypass mode, the flow directing members 39 act as thermal barriers to separate the hot exhaust gas flow from the leading edges of each TEG unit 40. This means that the leading edges of the TEG units 40 cool more quickly so that full flow mode can be resumed more quickly and therefore more of the energy contained in the exhaust gas is utilised by the TEG module 20 to generate electricity.

The flow directing members are fin-shaped and extend across the entire leading edge of the respective TEG unit 40. More particularly, each flow directing member 39 extends away from the leading edge of the respective TEG unit 40 into the exhaust gas flow paths 28, 30 by a varying extent such that the greatest extent of projection is at an inlet end of the flow directing member 39 (i.e. each member 39 is widest at a point closest to the inlet pipe). The shape and position of adjacent flow directing members 39 is such that they act to change the direction of the flow of exhaust gasses to avoid or reduce the hot gasses directly hitting the leading edge region of the TEG units 40. In the embodiment of FIG. 5, the flow directing members 39 have a curved profile for directing flow.

In some embodiments, a gap 68 is defined between the leading edge of the TEG unit 40 and its respective flow directing member 39. In bypass mode, the gap 68 acts to separate the leading edges of the TEG units 40 from both the hot flow of exhaust gas and from the flow directing members 39. This provides a further thermal barrier against direct heating of the leading edges of the TEG units 40 by the exhaust flow and indirect heating through the flow directing members 39.

FIG. 5 illustrates a gap 68 between a leading edge of a TEG unit 40 and its respective flow directing member 39. This gap 68 may optionally be filled with a gas permeable material. The permeability of the gap 68 allows gas exchange between exhaust gas passages 46 to equalise pressure between those passages 46, resulting in a balanced flow distribution, allowing each TEG unit 40 to perform at a similar level.

An adhesive may be used in the gap 68 alongside, or in place of, a permeable material. The adhesive provides coupling between the TEG unit 40 and the flow directing member 39, and may also enhance thermal protection.

In some embodiments, the heights of the flow directing members 39 are varied according to distance from the inlet pipe 24 in a direction along the main axis of the energy recovery unit 8, with the height of the flow directing members 39 typically being inversely proportional to the distance from the inlet pipe 24. This further maximises the efficiency of the TEG module 20.

Figure 6A:
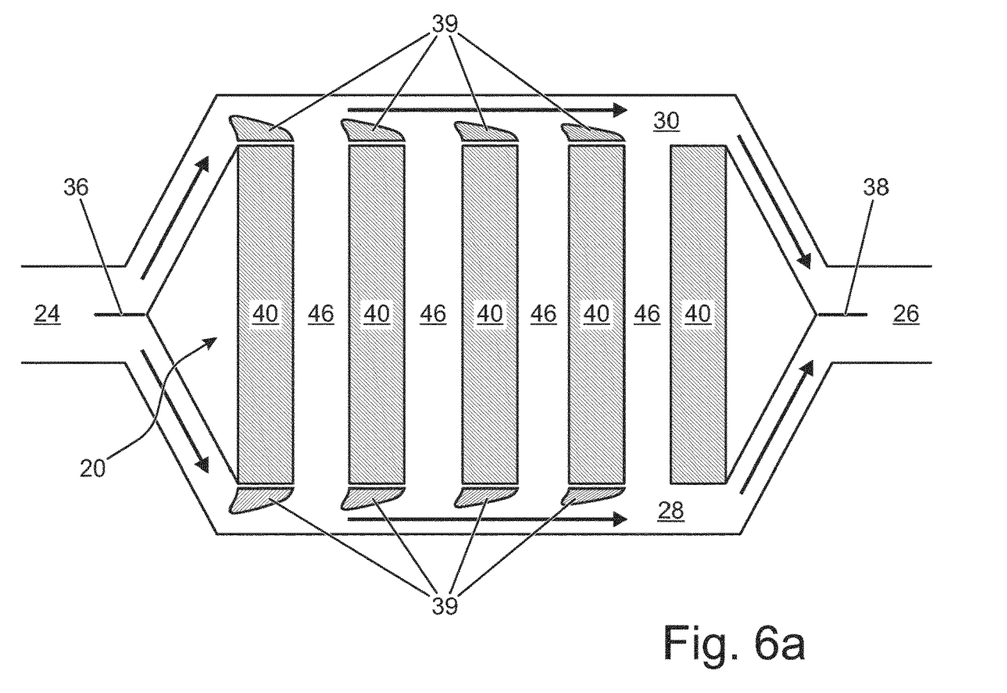
FIG. 6a is a schematic plan view of an alternative energy recovery unit in accordance with the invention in a bypass mode.
Figure 6B:
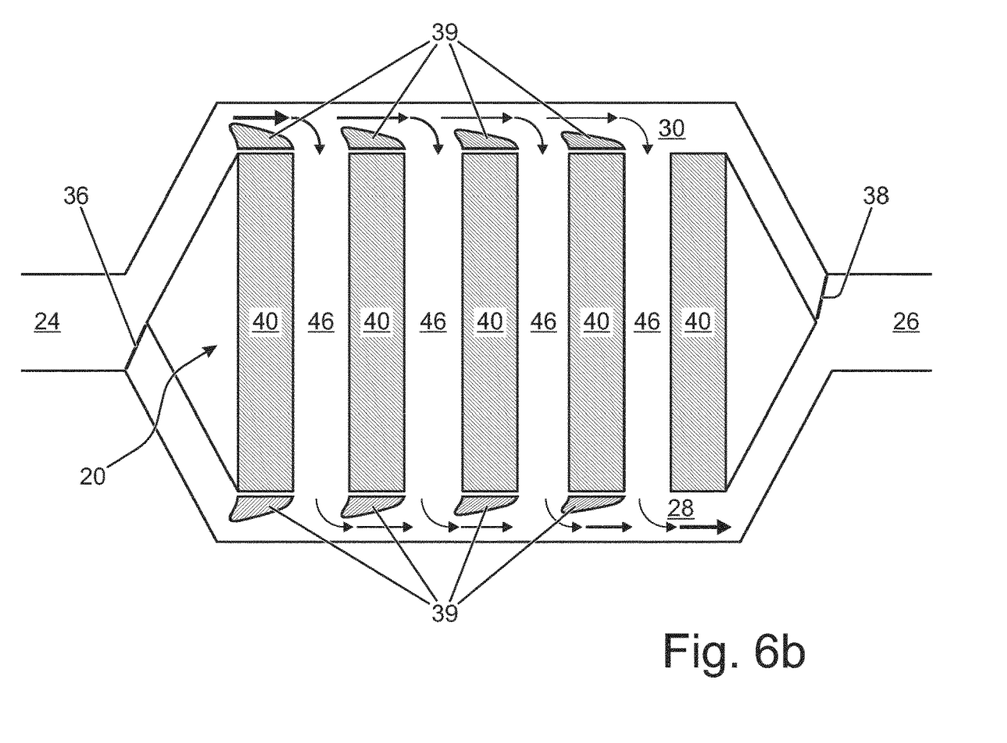
FIG. 6b is a schematic plan view of the energy recovery unit of FIG. 6a in a full flow mode.

FIGS. 6a and 6b show a schematic plan view of an alternative energy recovery unit in accordance with the invention, in different modes. The energy recovery unit has fin-shaped flow directing members 39 positioned adjacent the leading edge of the TEG units 40 in a similar configuration to those described in relation to FIG. 5. The flow directing members 39 vary in size depending on their distance from the inlet pipe 24 with the flow directing member 39 closest to the inlet pipe 24 having the greatest height (i.e. projecting furthest into the bypass passage 28, 30 from the TEG unit 40).

The energy recovery unit of FIG. 6a is shown in the bypass mode wherein neither the inlet valve flap 36 nor the outlet valve flap 38 is substantially deflected such that they lie substantially parallel to the main flow direction of the exhaust gas entering from the inlet pipe 24. In the bypass mode the flow directing members 39 are positioned within the bypass ducts 28, 30 between the exhaust gas flow and the leading edges of the TEG units 40 such that they protect the leading edges from direct exposure to the exhaust gases and thereby acting as thermal barriers. The larger flow directing members 39 positioned closest to the inlet pipe 24 provide greater thermal barriers. FIG. 6b shows the energy recovery unit of FIG. 6a in a full flow mode.

Figure 7:
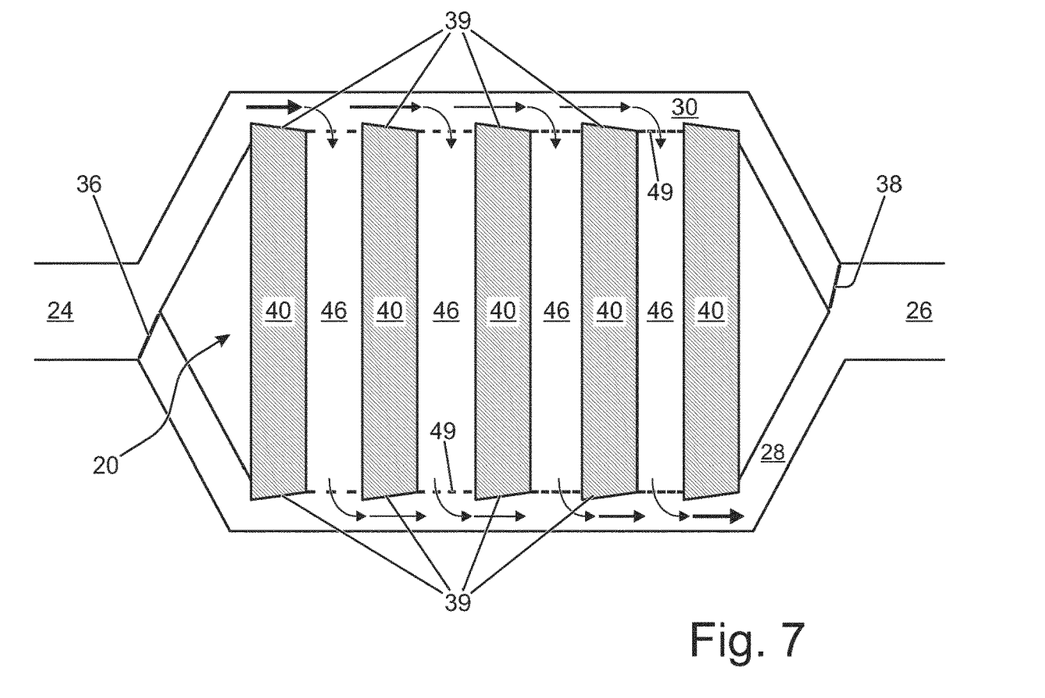
FIG. 7 is a schematic plan view of an alternative energy recovery unit in accordance with the invention.
Figure 8:
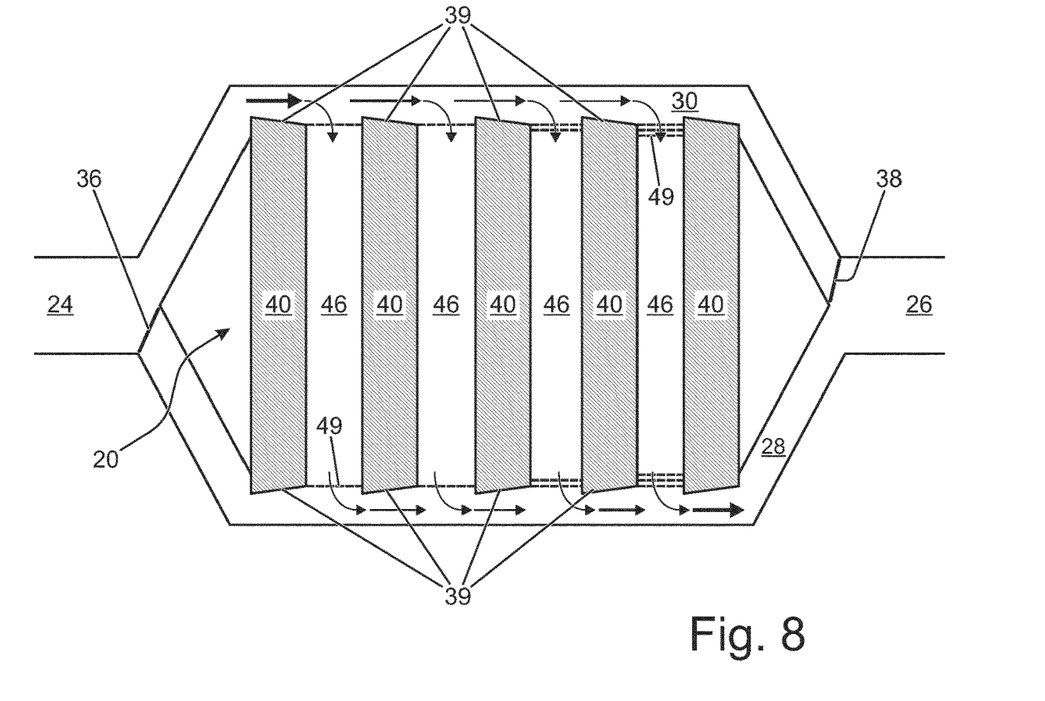
FIG. 8 is a schematic plan view of an alternative energy recovery unit in accordance with the invention.

FIGS. 7 and 8 show further embodiments of the invention in which the flow directing members 39 are wedge-shaped. Each flow directing member 39 extends over the entire leading edge of the TEG units such that the wide portion of the wedge is at an inlet end of the leading edge (i.e. closest to the inlet pipe 24). A flow directing member is positioned at each end of the TEG unit to provide a thermal barrier to gasses flow through both the lower and upper bypass ducts 28, 30. In the illustrated embodiments, the wedge-shaped flow directing members 39 are uniform in size; however it will be appreciated that they may vary in size in a similar manner to the embodiments described above.

The embodiment of FIG. 7 further includes a mesh structure 49 extending over the entrance to the TEG module 20 between the TEG units 40. The mesh 49 acts to further balance the flow between the units 40 by providing variation in resistance to flow therethrough. More particularly, the mesh 49 provides greater resistance to flow between units 40 spaced further away from the inlet pipe 24 of the energy recovery unit.

In the embodiment of FIG. 7 this variation in resistance is achieved by varying the porosity of the mesh 49 according to distance from the inlet pipe 24 in a direction along the main axis of the energy recovery unit. More particularly, the porosity decreases as it extends away from the inlet pipe 24 i.e. the porosity of the mesh 49 is inversely proportional to the distance from the inlet pipe 24.

The energy recovery unit of FIG. 8 also includes a mesh structure 49 extending between the TEG units 40. However, variation in resistance is achieved by having greater or fewer layers of the mesh structure 49 at the entrance to the passages 46, specifically by having fewer mesh structures 49 in the passages closest to the inlet pipe 24 and a greater number of mesh structures 49 in the passages closest the outlet pipe 26. In the illustrated embodiments the passages closest to the inlet pipe 24 include a single layer of mesh 49 and the passage closest to the outlet pipe 26 includes three layers of mesh 49, with intermediate passages, between these passages, including two layers of mesh 49. Where there are multiple layers or mesh 49 these are spaced from each other along the passage 46 in the direction of exhaust gas flow therethrough. The mesh layers 49 may have the same porosity as each other, or may vary in porosity.

Figure 9A:
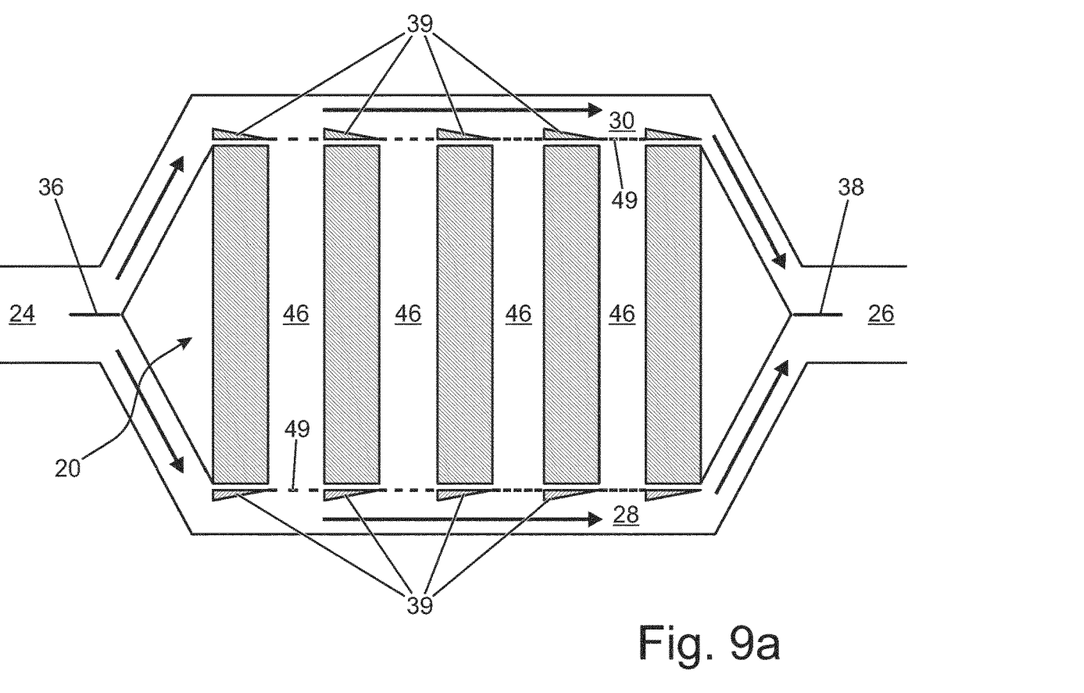
FIG. 9a is a schematic plan view of an alternative energy recovery unit in accordance with the invention.
Figure 9B:
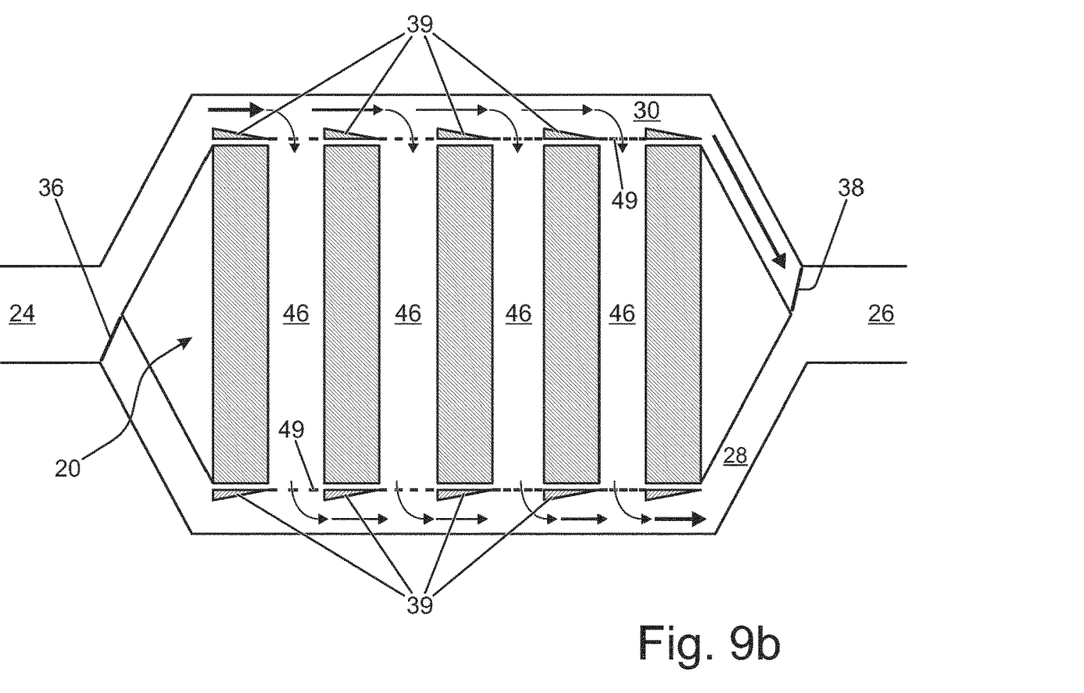
FIG. 9b is a schematic plan view of the energy recovery of FIG. 9a in a full flow mode.

FIGS. 9a and 9b show an alternative embodiment having similar arrangements to that described in relation to FIG. 7 above. In this embodiment, a mesh structure 49 extends over the entrance of the passages 46 between TEG units 40. The mesh structure 49 varies in porosity such that the porosity of the mesh 49 is inversely proportional to its distance from the inlet pipe 24. The arrangement differs from that shown in FIG. 7 in that the wedge-shaped flow directing members 39 are spaced from the leading edge of the TEG units 40 to define a gap between the flow directing members 39 and the leading edge of the TEG units 40. The mesh 49 is attached to and extends between the flow directing members 30 to provide the variation in flow resistance. FIG. 9a shows the arrangement in bypass mode and FIG. 9b shows the arrangement in full flow mode.

Figure 10:
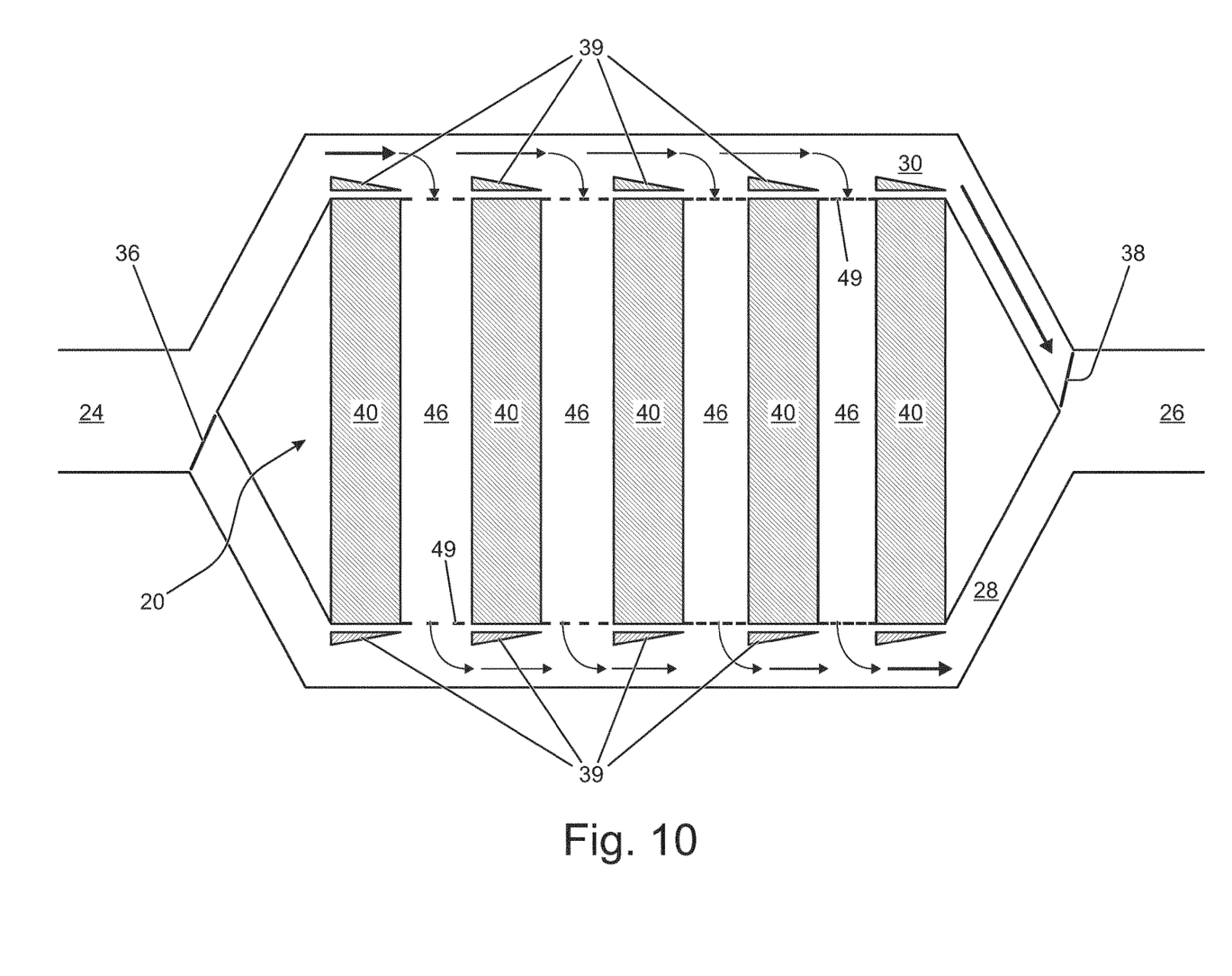
FIG. 10 is a schematic plan view of an alternative energy recovery unit in accordance with the invention.

FIG. 10 shows a variation of the embodiment of FIGS. 9a and 9b in which the mesh is attached to and extends between the TEG units 40 rather than the flow directing members 39. The mesh is positioned at or adjacent the leading edge of the TEG units 40 at both ends thereof.

Figure 11:
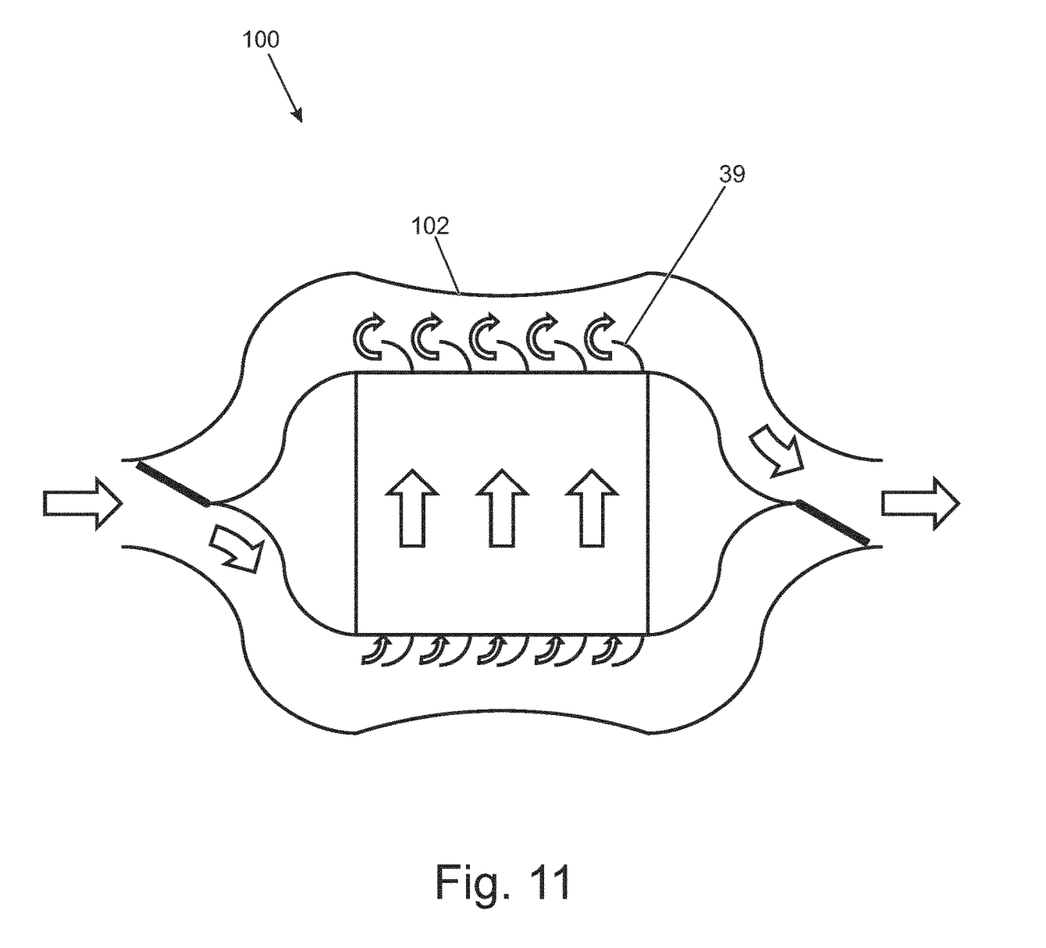
FIG. 11 is a schematic top view of an energy recovery unit with curved bypass duct walls according to an embodiment of the invention.

In some embodiments, the effect of the flow directing members 39 can be enhanced by incorporating non-parallel bypass duct walls. An example of this is shown in FIG. 11, which illustrates an energy recovery unit 100 comprising curved bypass duct walls 102. The curved bypass walls 102 enhance the distribution of flow through the exhaust gas passages (not shown). The flow directing members 39 are curved towards the inlet pipe at both sides of the TEG module.

It should be noted that the flow directing members 39 in some embodiments are held in place by a means of attachment that could comprise, but is not limited to, the clamping band 50, as noted above, and/or an adhesive. In other embodiments, the flow directing members 39 are connected to neighbouring flow directing members 39 and form a tension support structure for the TEG module 20, which can replace and perform the same function as the clamping band. In operation, the high pressure flow acts to allow the flow directing members 39 to 'self clamp'.

Figure 12:
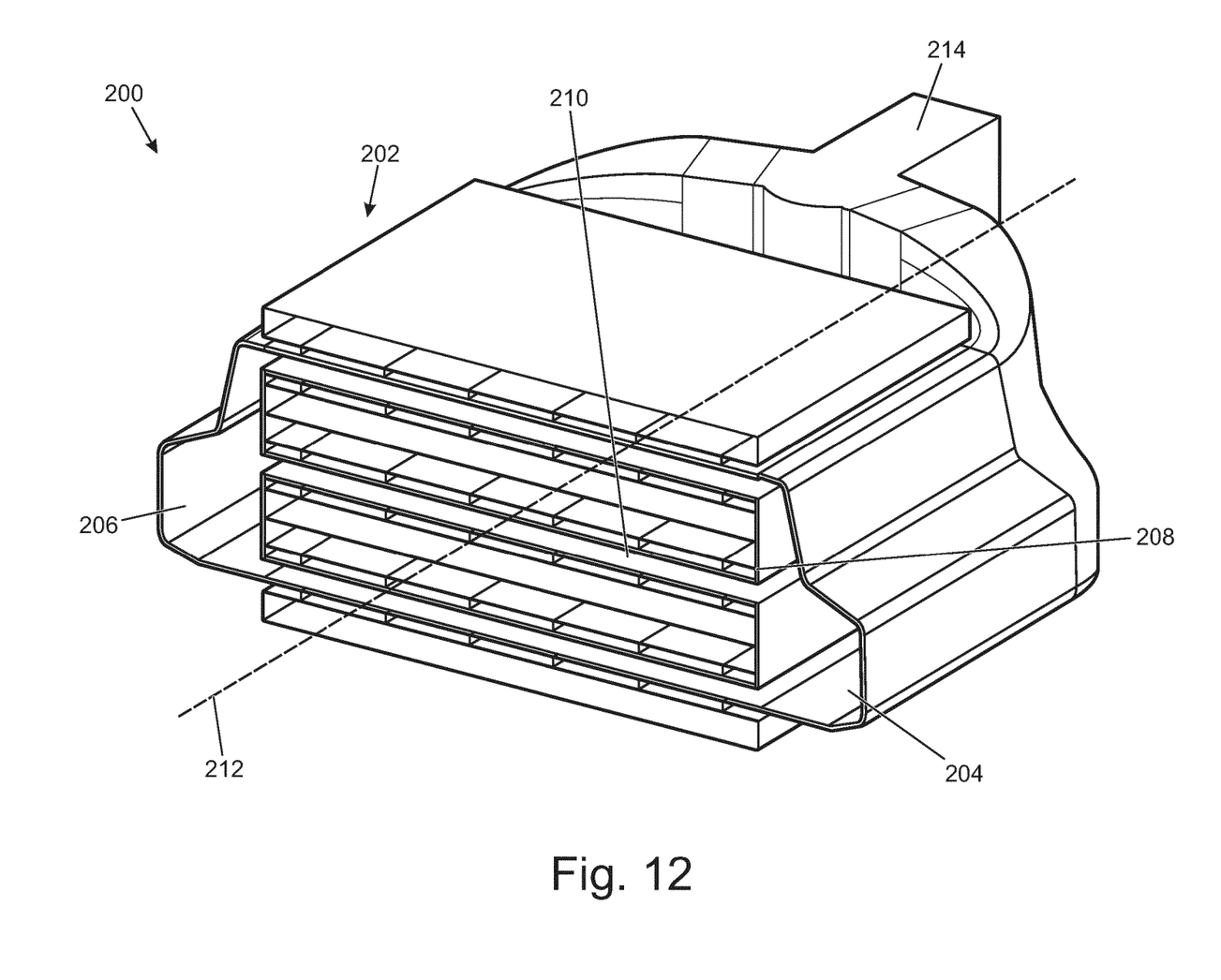
FIG. 12 is a perspective, cross-sectional view of the energy recovery unit shown in FIG. 2, in accordance with another embodiment of the present invention.

FIG. 12 shows a perspective cross-sectional view of an energy recovery unit 200 incorporating a TEG module 202 according to another embodiment of the present invention. In this embodiment bypass ducts 204, 206 flank each side of the TEG module 202. However, the TEG module 202 differs from that of previous embodiments in that the TEG units 208 and exhaust gas passages 210 defined between those units 208 are oriented to lie parallel to a plane containing the main axis 212.

Moreover, each TEG unit 208 extends substantially along the entire length of the bypass ducts 204, 206 such that exhaust flow can enter each exhaust gas passage 210 of the TEG module 202 at any longitudinal point in the bypass ducts 204, 206.

Exhaust gas flows generally horizontally through the exhaust gas passages 210. It is noted that, in the absence of features to direct the exhaust flow orthogonally relative to the main axis 212, typically the exhaust gas takes a diagonal path through each exhaust gas passage 210, as exhaust gas that enters an exhaust gas passage 210 at an end of the energy recovery unit 200 near to the inlet pipe (not shown) will tend to exit the passage at a longitudinal point that is closer to the outlet pipe 214.

Many modifications may be made to the above examples without departing from the scope of the present invention as defined in the accompanying claims.

The invention claimed is:

1. An energy recovery unit for use in a vehicle exhaust system, the energy recovery unit comprising:
   an inlet for receiving exhaust gas from the exhaust system;
   an outlet for returning exhaust gas to the exhaust system;
   a plurality of thermoelectric generators disposed between the inlet and the outlet defining a plurality of exhaust gas passages therebetween; and
   a plurality of flow balancing members disposed across the plurality of exhaust gas passages or adjacent an inlet to each of the plurality of exhaust gas passages, each flow balancing member being configured to control exhaust gas flow through a respective exhaust gas passage to balance exhaust gas flow between the plurality of thermoelectric generators, wherein each flow balancing member adjacent the inlet to each of the plurality of exhaust gas passages is separated from a leading edge of the thermoelectric generators by a gap configured to separate a respective thermoelectric generator from the exhaust gas and from a respective flow balancing member.

2. The energy recovery unit of claim 1, wherein the gap is either or both gas permeable and comprising an adhesive.

3. The energy recovery unit of claim 2, wherein the gap comprises a gas permeable material.

4. An energy recovery unit for use in a vehicle exhaust system, the energy recovery unit comprising:
an inlet for receiving exhaust gas from the exhaust system;
an outlet for returning exhaust gas to the exhaust system;
a plurality of thermoelectric generators disposed between the inlet and the outlet defining a plurality of exhaust gas passages therebetween; and
a plurality of flow balancing members disposed across the plurality of exhaust gas passages or adjacent an inlet to each of the plurality of exhaust gas passages,
each flow balancing member being configured to control exhaust gas flow through a respective exhaust gas passage to balance exhaust gas flow between the plurality of thermoelectric generators, wherein the plurality of flow balancing members adjacent the inlet to each of the plurality of exhaust gas passages are not uniform in size.

5. The energy recovery unit of claim 4, wherein the size of each flow balancing member is inversely proportional to its distance from the inlet.

6. An energy recovery unit for use in a vehicle exhaust system, the energy recovery unit comprising:
an inlet for receiving exhaust gas from the exhaust system;
an outlet for returning exhaust gas to the exhaust system;
a plurality of thermoelectric generators disposed between the inlet and the outlet defining a plurality of exhaust gas passages therebetween; and
a plurality of flow balancing members disposed across the plurality of exhaust gas passages or adjacent an inlet to each of the plurality of exhaust gas passages,
each flow balancing member being configured to control exhaust gas flow through a respective exhaust gas passage to balance exhaust gas flow between the plurality of thermoelectric generators, wherein the plurality of flow balancing members are mesh structures disposed across the plurality of exhaust gas passages.

7. The energy recovery unit of claim 6, wherein each flow balancing member is connected to an adjacent flow balancing member.

8. The energy recovery unit of claim 6, wherein the flow balancing members are positioned at either end of or within the respective passage.

9. The energy recovery unit of claim 6, wherein the flow balancing members are curved, fin-shaped or wedge-shaped members disposed adjacent an inlet of each passage.

10. The energy recover unit of claim 6, wherein a pore density in each mesh structure varies in relation to its distance from the inlet such that the mesh structure has higher porosity closer to the inlet.

11. The energy recovery unit of claim 6, comprising a valve arrangement operable to direct exhaust gas entering the inlet across each thermoelectric generator to enable each thermoelectric generator to generate electrical energy from thermal energy contained in the exhaust gas, wherein the valve arrangement is operable to vary the direction of exhaust gas flow across each thermoelectric generator.

12. The energy recovery unit of claim 6, comprising a gas pipe network configured to connect the inlet and the outlet.

13. The energy recovery unit of claim 12, wherein the gas pipe network comprises two bypass ducts disposed along respective opposing ends of the plurality of thermoelectric generators, each bypass duct extending between the inlet and the outlet.

14. The energy recovery unit of claim 13, wherein each thermoelectric generators is spaced from its neighbouring thermoelectric generators to define a plurality of exhaust gas passages, wherein the exhaust gas passages allow exhaust gas to flow between the two bypass ducts.

15. The energy recovery unit of claim 14, wherein the exhaust gas passages are arranged such that a flow direction through each exhaust gas passage is perpendicular to a flow direction through each bypass duct.

16. The energy recovery unit of claim 14, wherein the energy recovery unit is configured to operate in a bypass mode in which exhaust gas can flow from the inlet to the outlet via the bypass ducts without entering the plurality of exhaust gas passages, wherein the flow balancing members are configured to act as thermal barriers to separate the exhaust gas flow from the edges of each thermoelectric generator in the bypass mode.

17. A vehicle comprising the energy recovery unit of claim 6.

18. The energy recovery unit of claim 6, wherein the mesh structure includes variation in the number of layers of mesh such that fewer layers are present closer to the inlet.

* * * * *